(12) United States Patent
Tomsio et al.

(10) Patent No.: US 7,116,126 B2
(45) Date of Patent: Oct. 3, 2006

(54) INTELLIGENT DELAY INSERTION BASED ON TRANSITION

(75) Inventors: Nayon Tomsio, Austin, TX (US); Harsh D. Sharma, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 1122 days.

(21) Appl. No.: 09/978,495

(22) Filed: Oct. 16, 2001

(65) Prior Publication Data

US 2003/0072332 A1 Apr. 17, 2003

(51) Int. Cl.
H03K 17/16 (2006.01)
H03K 19/003 (2006.01)
H03H 11/26 (2006.01)

(52) U.S. Cl. .............................. 326/26; 326/21; 326/22; 326/23; 326/24; 326/25; 326/27; 326/28; 326/29; 326/30; 327/263; 327/276; 327/277

(58) Field of Classification Search ............ 326/21–30, 326/83; 327/23, 108, 263, 276–277
See application file for complete search history.

(56) References Cited

U.S. PATENT DOCUMENTS

| | | | |
|---|---|---|---|
| 4,404,663 A | 9/1983 | Saeki et al. | |
| 5,306,967 A | 4/1994 | Dow | |
| 5,313,501 A | 5/1994 | Thacker | |
| 5,362,996 A * | 11/1994 | Yizraeli | 326/27 |
| 5,646,543 A * | 7/1997 | Rainal | 326/26 |
| 5,994,946 A | 11/1999 | Zhang | |
| 6,008,705 A | 12/1999 | Ghoshal | |
| 6,414,542 B1 | 7/2002 | Lin et al. | |
| 6,532,574 B1 | 3/2003 | Durham et al. | |
| 6,570,931 B1 | 5/2003 | Song | |
| 2001/0046205 A1 | 11/2001 | Easton et al. | |
| 2002/0124230 A1 | 9/2002 | Cai et al. | |
| 2003/0031194 A1 | 2/2003 | Sharma et al. | |
| 2003/0108109 A1 | 6/2003 | Khieu et al. | |
| 2003/0120982 A1* | 6/2003 | Levy et al. | 714/700 |
| 2005/0094709 A1 | 5/2005 | Lakkis | |

* cited by examiner

Primary Examiner—James Cho
Assistant Examiner—Jason Crawford
(74) Attorney, Agent, or Firm—Zagorin O'Brien Graham LLP

(57) ABSTRACT

A method of transmitting adjacent signals is disclosed. Sensing is performed on signals in the group and adjacent signals are either switched or delayed if the adjacent signals are switching at the same time. The method is used in networks where coupling and capacitance effects are possible.

66 Claims, 10 Drawing Sheets

INTELLIGENT DELAY INSERTION BASED ON TRANSITION

BACKGROUND OF THE INVENTION

1. Field of the Invention

This invention relates to a method and system using delay signals to reduce or eliminate interference between paths in a communication network, in particular an electronic circuit.

2. Description of the Related Art

Communication networks, in particular communication networks on integrated circuits, have numerous paths carrying signals from one device to other devices. Multiple paths that are placed near one another can lead to problems related to coupling and capacitative interference. The situation becomes most problematic when multiple paths carrying signals that transition or switch at the same time, run parallel to a single path switching in the opposite direction.

Coupling effects do not have a noticeable effect upon signals that are switching in the same direction. In a digital signal transmission, the rise of the signal from a driver connected to a path is not affected by signals from the other paths switching in the same direction. Coupling effects, however, can have an effect upon the paths whose signals switch in the opposite direction. In particular coupling effects lead to slower rise times of path signals. To compensate for slower rise times, path driver power is increased. Path drivers are required to provide additional power to compensate for a slower rise time in order to get signals out and to achieve proper signal level and timing requirements.

In certain designs, neutral paths such as ground paths, also known as shield lines, are available and placed between aggressors and victim paths, effectively shielding the opposite switching paths from one another. Shield lines typically serve no function but are merely used to shield the victim path. The use of neutral paths or shield lines also leads to design considerations and network architecture constraints in laying out paths. Adding shield lines further adds to an increase in the space of the network. In an integrated circuit, minimizing size is highly desirable, and adding non-functional shield lines becomes counter productive to meeting the goal of minimizing size.

SUMMARY OF THE INVENTION

In one embodiment, a method of transmitting a signal is disclosed. The method includes sensing adjacent signals and delaying certain adjacent signals until switching or transition takes place with the other adjacent signal or signals.

In certain embodiments, various number signal groups including two-signal, three-signal, and five-signal groups sense and delay for particular signals. Signals that are adjacent to more than one signal are delayed in the event that any or all of the adjacent signals simultaneously switch with the particular signals.

In certain embodiments, a separate sensing and delay circuit is provided. Along with buffers, the sensing and delay circuit provides a delay signal to the buffers in the event that adjacent signals switch simultaneously, thus delaying an adjacent signal.

In other embodiments, the method assigns priorities to transmitted signals. Signals that have a lower priority compared to signals with a higher priority are delayed until the higher priority signals are switched. In certain embodiments, a delay pulse is sent to by the higher priority signal or signals to the lower priority signal or signals.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features and advantages made apparent to those skilled in the art by referencing the accompanying drawings. The use of the same reference number throughout the figures designates a like or similar element.

Figure 1A:
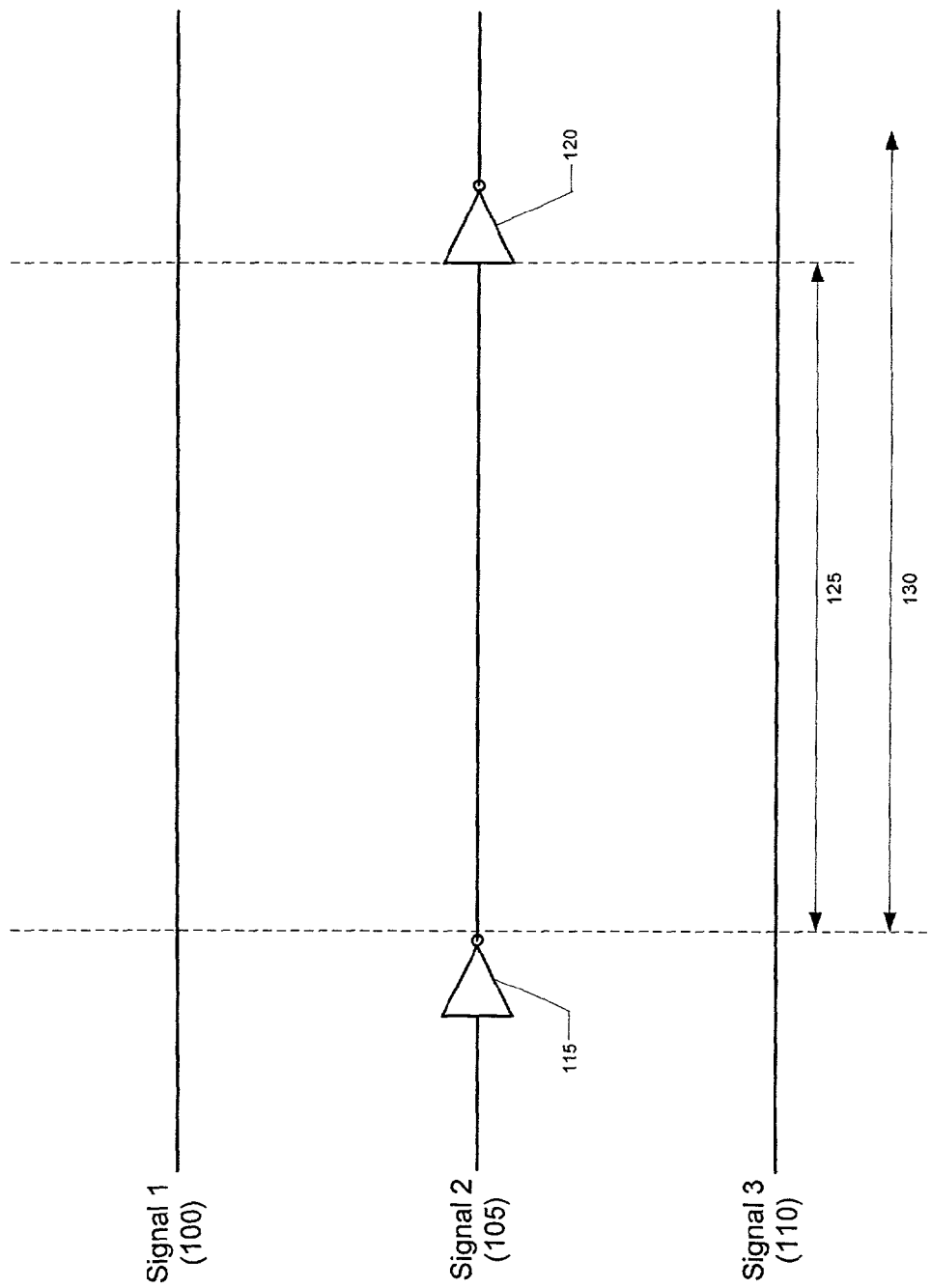
FIG. 1A is a diagram illustrating the use of inverter delays to avoid coupling interference.

While the invention is susceptible to various modifications and alternative forms, specific embodiments thereof are shown by way of example in the drawings and will herein be described in detail, it should be understood, however, that the drawings and detailed description thereto are not intended to limit the invention to the particular form disclosed but on the contrary, the intention is to cover all modifications, equivalents, and alternatives falling within the scope of the present invention as defined by the appended claims.

DETAILED DESCRIPTION

The following is intended to provide a detailed description of an example of the invention and should not be taken to be limiting of the invention itself. Rather, any number of variations may fall within the scope of the invention which is defined in the claims following the description.

Introduction

The present invention provides a method and apparatus for avoiding or minimizing coupling interference in adjacent paths in a communication network by sensing transitioning (switching) instances of adjacent paths and delaying a signal from transitioning while adjacent signal(s) transitions. Coupling interference is avoided between the adjacent signal paths by assuring sufficient time differences exist between the transitioning of the adjacent signals. A signal transitions (switches) without coupling interference from a simultaneously switching adjacent signal.

Delay Signals

FIG. 1A is a diagram illustrating the use of inverter delays to avoid coupling interference. Signal 1 100 is an adjacent signal to Signal 2 105. Signal 2 105 is an adjacent signal to Signal 3 110. In order to avoid coupling interference, in particular when Signal 1 100, Signal 2 105, and Signal 3 110 are switching, a delay is provided in the form of an inverter 115 along the path of Signal 2 105. Switching of a signal takes place on either a rising or falling edge of the signal. In this particular example, the signals are digital signals representing either a "1" or "0" value. Signal 2 105 is restored later along the transmission line is by inverter 120. In other words, the signal 2 105 is inverted once again to restore the original transmitted value prior to inverter 115. The path of inverted Signal 2 105 is presented by path length 125. Because of the delay from inverter 115 and 120, a non-coupling zone 125 is provided assuming signal 2 105 is not delayed such that signal 2 105 switches at the same time as signal 1 100 and/or signal 3 110. Within non-coupling zone 130, there is a small likelihood of coupling interference between signals 100, 105 and 110, assuming that delay to Signal 2 105 would not cause Signal 2 105 to couple with Signal 1 100 and Signal 3 110.

Figure 1B:
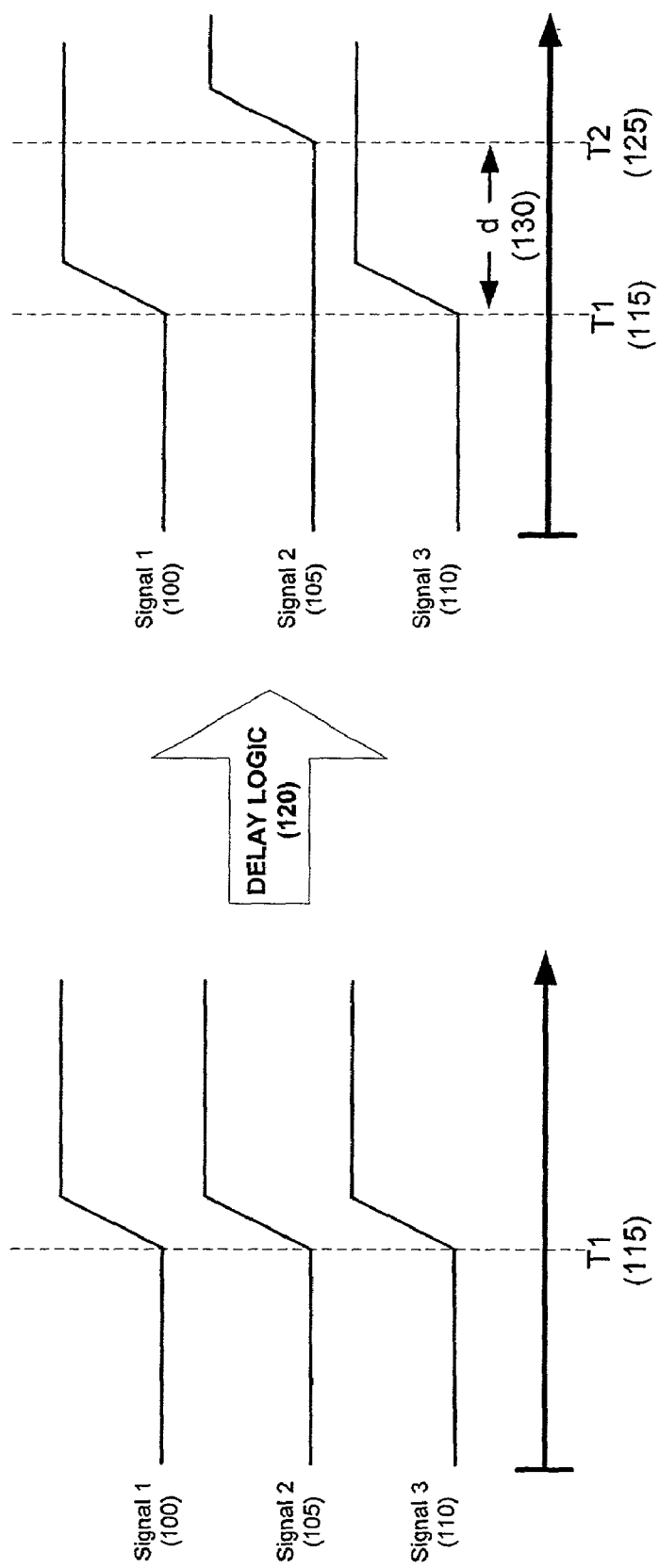
FIG. 1B is a timing diagram illustrating a three-signal group with delay provisioning.

FIG. 1B is a timing diagram illustrating a three-signal group with delay provisioning. Signal 1 100, signal 2 105, and signal 3 110 are part of a three-signal group with signal 2 105 placed between signal 1 100 and signal 3 110. Whenever signals 100 and 105, or signals 105 and signal 110 switch simultaneously, in this particular example the three signals 100, 105, 110 are switching at time T1 115, a delay is performed by delay logic 120. Delay logic 120 provides a sufficient delay to signal 2 105 in order to prevent simultaneous switching with signal 1 100 and/or signal 3 110. Signal 2 105 switches at time T2 125. The delay is a delay d 130. Delay d 130 can be a predetermined period of time or any amount of time sufficient to prevent simultaneous switching with signal 2 105 and adjacent signal 1 100 and signal 3 110. The delay avoids any coupling interference in the event that signal 2 105 is an opposite switching signal to either signal 1 100 and/or signal 3 110.

Figure 1C:
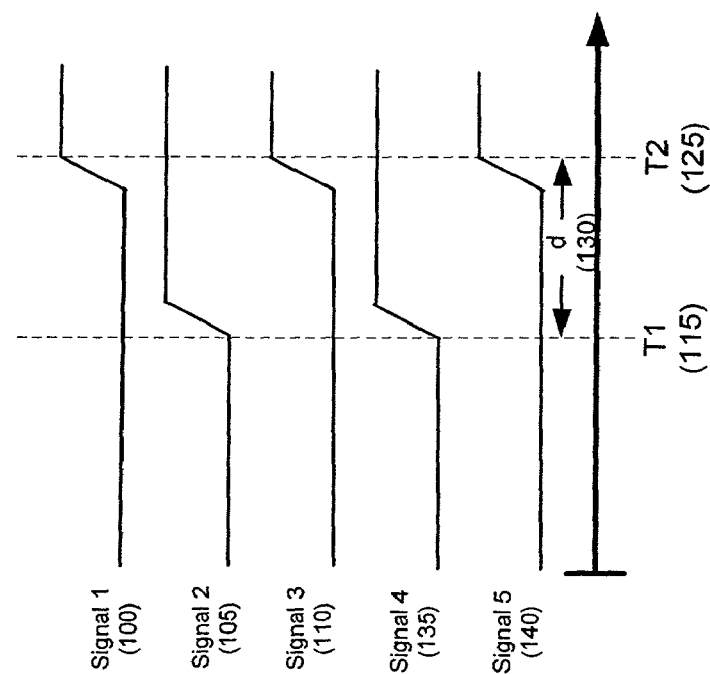
FIG. 1C is a timing diagram illustrating a five-signal group with delay provisioning.
Figure 1C:
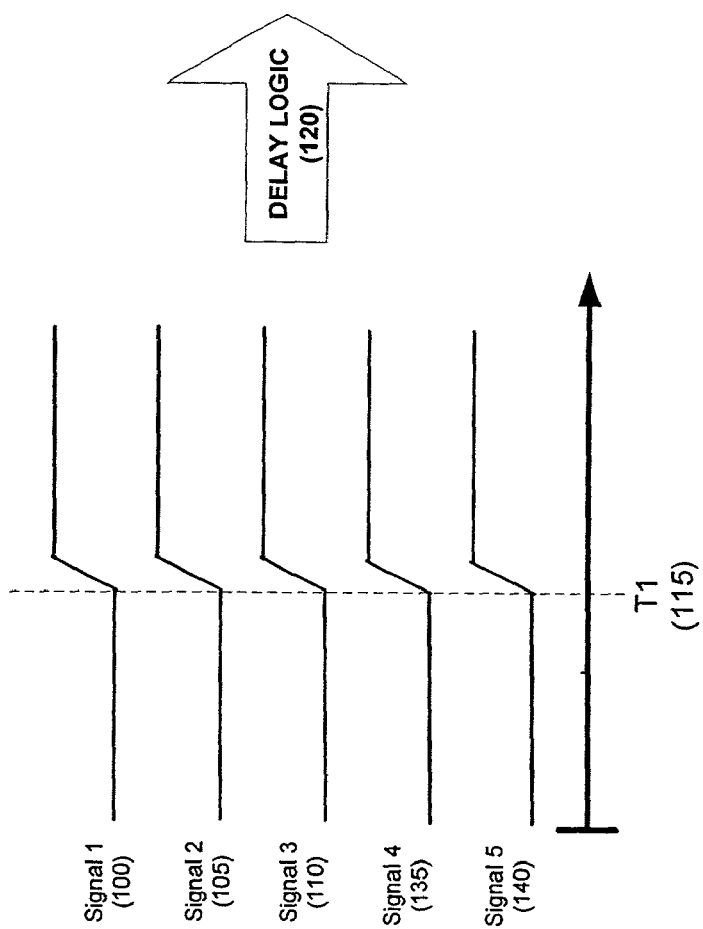

FIG. 1C is a timing diagram illustrating a five-signal group with delay provisioning. Signal 1 100, signal 2 105, signal 3 110, signal 4 135 and signal 5 140 are adjacent to one another in order. In this particular example, all five signals are switching at the same time, time T1 115. In this particular embodiment, delay logic 120 delays signal 1 100, signal 3 110, and/or signal 5 140 whenever simultaneous switching occurs with adjacent signal 2 105 and/or signal 4 135. Signal 2 105 and signal 4 135 are never delayed, and are allowed to switch at their initial switching time, in this case time T1 115. In this example, signal 1 100, signal 3 110, and signal 5 140 are delayed and switch at time T2 125. The delay d 130 can be a predetermined period or any sufficient amount of time that prevents simultaneous switching of signals. The delay avoids any coupling interference between adjacent simultaneously switching signals.

Figure 1D:
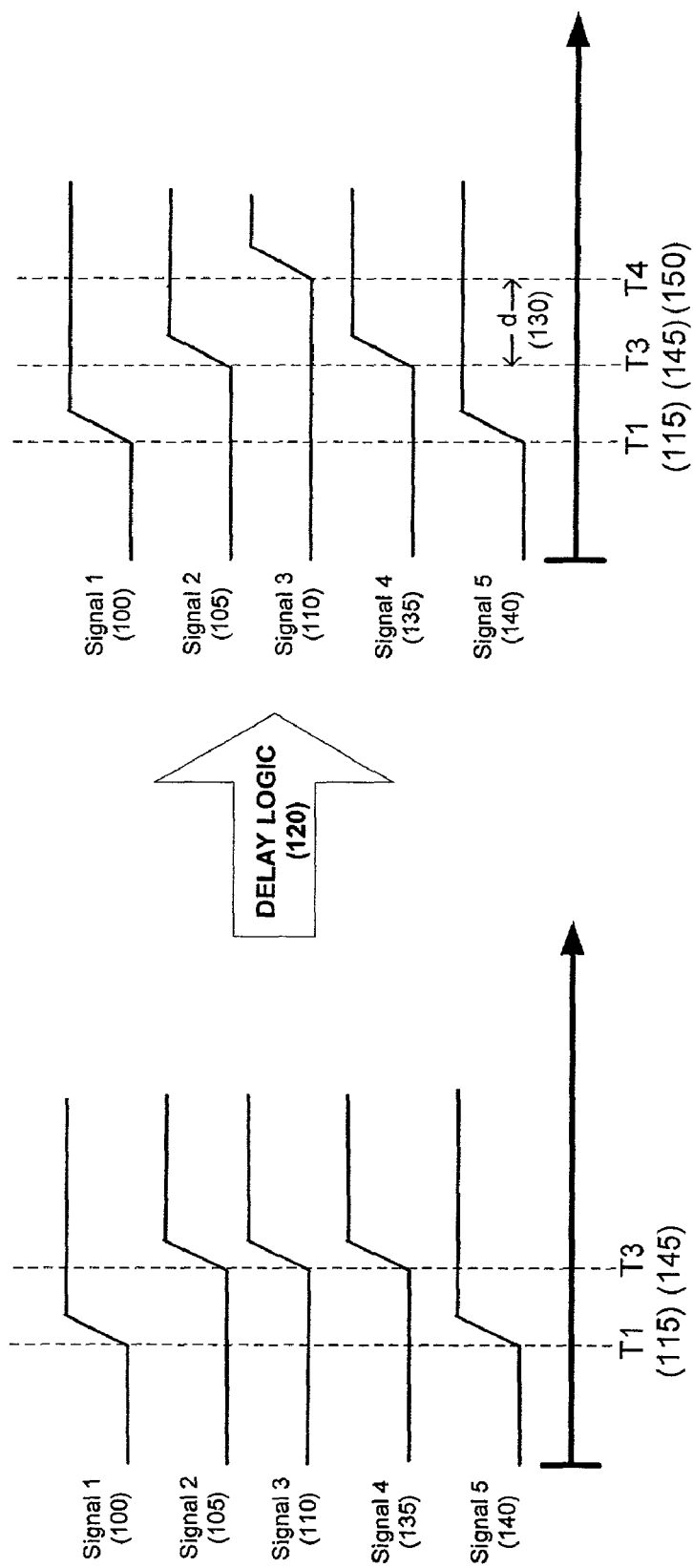
FIG. 1D is a timing diagram illustrating a five-signal group with delay provisioning when three adjacent signals switch simultaneously.

FIG. 1D is a timing diagram illustrating a five-signal group with delay provisioning when three adjacent signals switch simultaneously. In this particular example, signal 1 100 and signal 5 140 simultaneously switch at time T1 115. Signal 1 100 and signal 5 140 are far enough apart that simultaneously switching does not affect the respective signals. Signal 2 105, signal 3 110, and signal 4 135 simultaneously switch at time T3 145. In order to avoid any coupling interference, specifically if signal 3 110 is an opposite switching signal to signal 2 105 and/or signal 4 135, delay logic 120 delays signal 3 110. Signal 2 105 and signal 4 135, in this embodiment, are never delayed and switch at their respective original switch time T3 145. Signal 3 110 is switched at time T4 150, providing a delay of d 130. Delay d 130 can be a predetermined period of delay of any amount of delay sufficient to avoid simultaneously switching of adjacent signals.

Figure 1E:
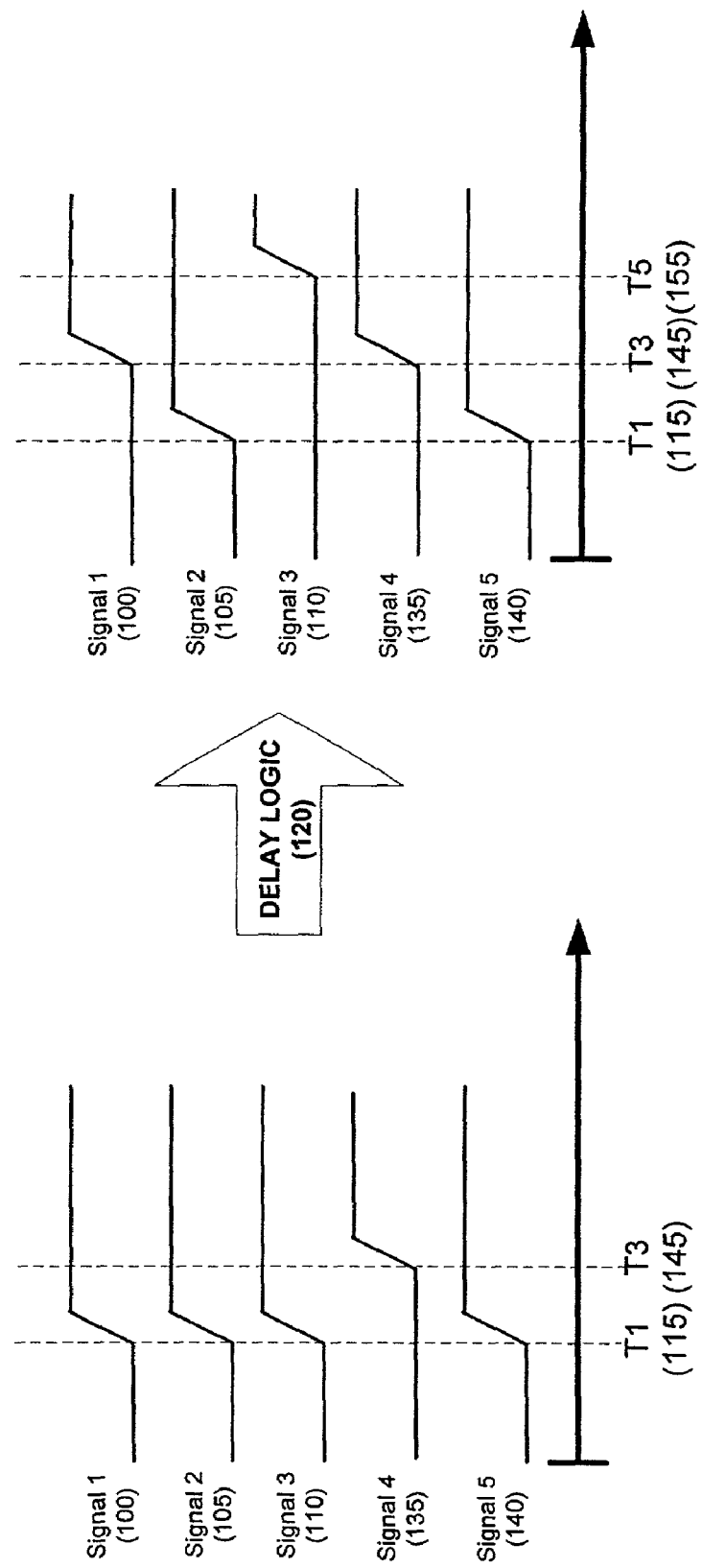
FIG. 1E is a timing diagram illustrating a five-signal group with an extended delay when initial delay results in simultaneously switching with an adjacent signal.

FIG. 1E is a timing diagram illustrating a five-signal group with an extended delay when initial delay results in simultaneously switching with an adjacent signal. In this particular embodiment of the invention, signal 2 105 and signal 4 135 are never delayed, and always switch at their respective original switch times, in this example signal 2 105 switches at time T1 115 and signal 4 135 switches at time T3 145. Signal 1 100, signal 3 110, and signal 5 140 switch at time T1 115, the same time that signal 2 105 switches. Delay logic 120 senses that adjacent signal 1 100 and signal 3 110 switch at the same time as signal 2 105, therefore a delay is provided to signal 1 100 and signal 3 110. Signal 1 100 now switches at time T3 145, the same time as signal 4 135, however the two signals are far enough removed from one another to avoid any coupling interference. Signal 3 110 would also be delayed to time T3 145, however, this condition would result in signal 3 110 switching at the same time as signal 4 135. Delay logic 120 therefore provides for signal 3 110 to be further delayed to time T5 155. The adjusted delayed timing diagram prevents adjacent signals from switching at the same times and avoids coupling interference when adjacent signals are switching opposite one another.

Sensing and Delay Logic

Figure 2:
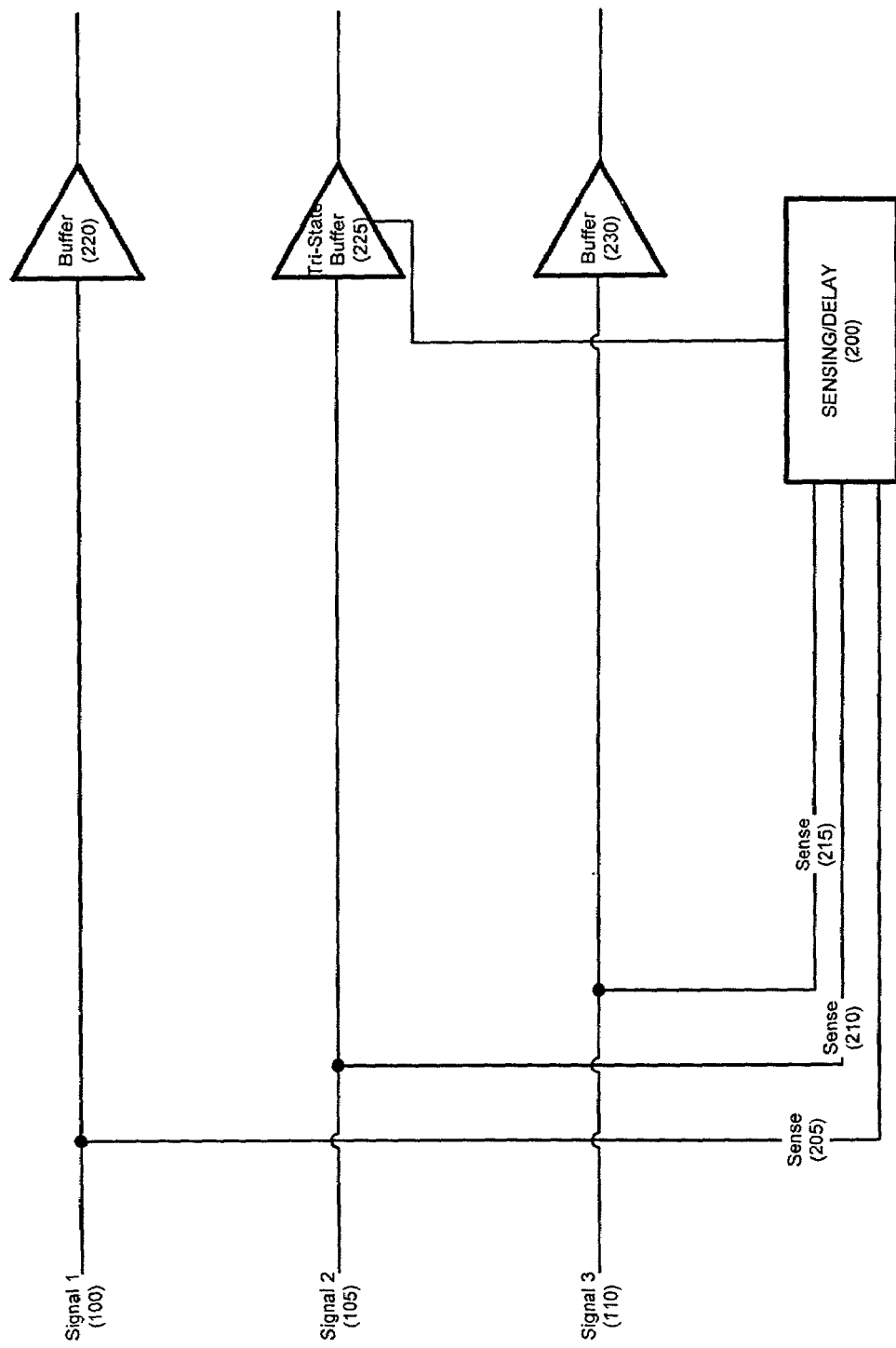
FIG. 2 is a block diagram illustrating use of a sensing and delay circuit and buffers to transition a three-signal group.

FIG. 2 is a block diagram illustrating use of a sensing and delay circuit and tri-state buffers to transition signals. Signals 100, 105, and 110 are monitored by sensing and delay circuit 200. Sensing and delay circuit 200 receives sense signals 205, 210, and 215 respectively from signal 1 100, signal 2 105, and signal 3 110. Sensing and delay circuit 200 determines if signal 2 105 switches at the same time as signal 1 100 and/or signal 3 110. If signal 2 105 switches at the same time as either adjacent signal 1 100 or adjacent signal 3 110, signal 2 105 is delayed. In this example, buffers 220 and 230 are buffers to match the delay of tri-state buffer 225 when there is no simultaneous switching. Tri-state buffer 225 provides for three possible values: a value of 0, 1, or a high impedance value. A signal may be switching on the rising edge, therefore a value of 1 is associated with it. A signal that is switching on the falling edge has a value of 0. A signal that has been delayed or is awaiting transition from sensing and delay circuit 200 maintains its binary signal value. The use of sensing and delay circuit 200 along with buffers 220, 225, and 230 assure that signal 1 100 and 3 110 are always immediately passed through. Signal 2 105 is immediately passed through without delay unless signal 2 105 switches at the same time as Signal 1 100 or Signal 3 110. Since signal 1 100 is far enough removed from signal 3 110, possibility of coupling interference between signal 1 100 and signal 3 110 is minimal.

Figure 3:
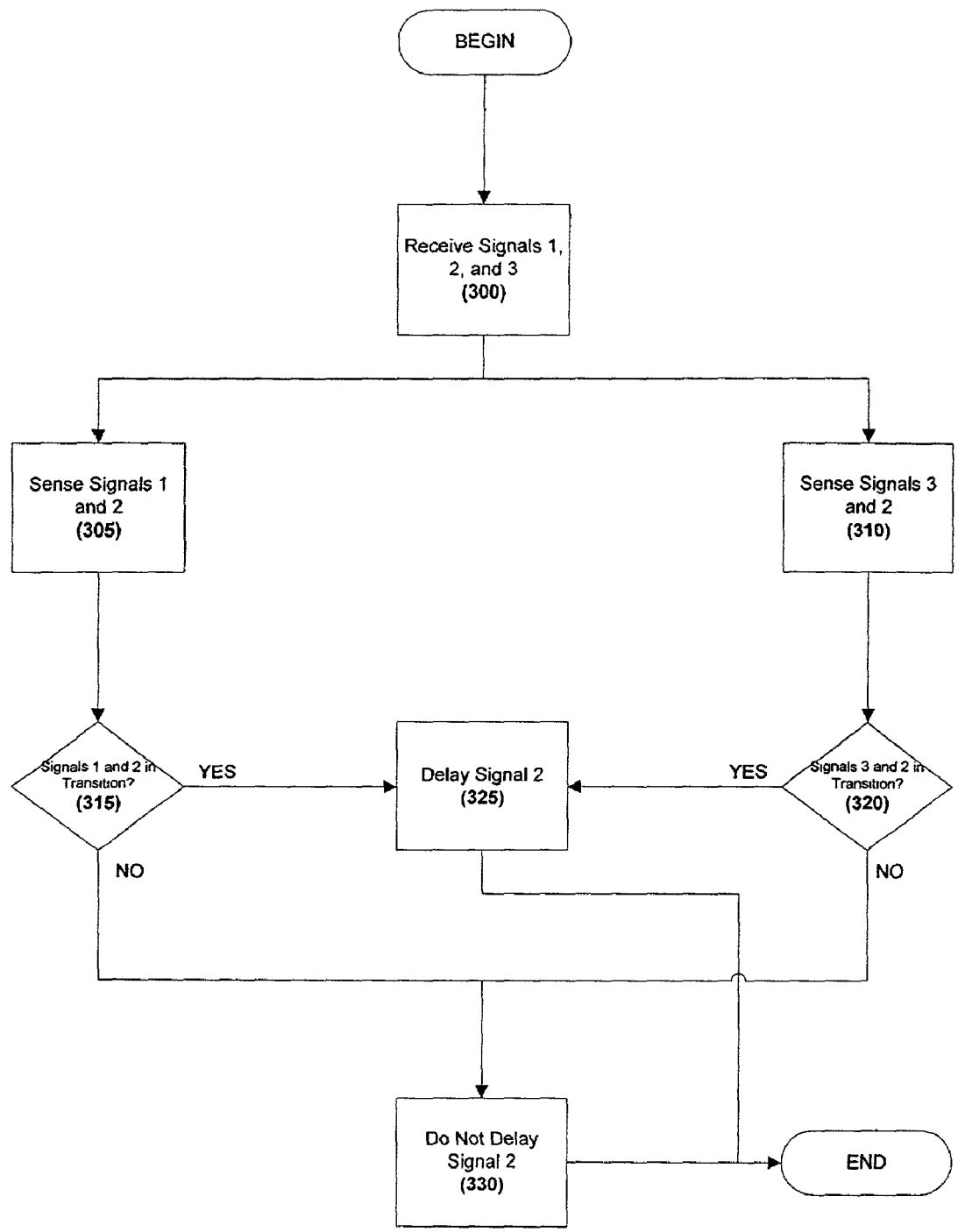
FIG. 3 is a flow diagram illustrating transition of adjacent signals for a three-signal group.

FIG. 3 is a flow diagram illustrating transition of adjacent signals for a three signal group. Sensing and delay circuit 200 receives signals 100, 105, and 110, step 300. Signals 100 and 105 are sensed at the same time, step 305. Simultaneously, signals 105 and 110 are also sensed with one another at the same time, step 310. A determination is made if signals 100 and 105 are switching at the same time, step 315. A determination is also made whether signals 105 and 110 are switching at the same time, step 320. If the condition is "yes" for either steps 315 or 320, then signal 2 105 is delayed, step 325. If steps 315 and 320 are both determined to be "no," then signal 2 105 is not delayed, step 330.

Figure 4:
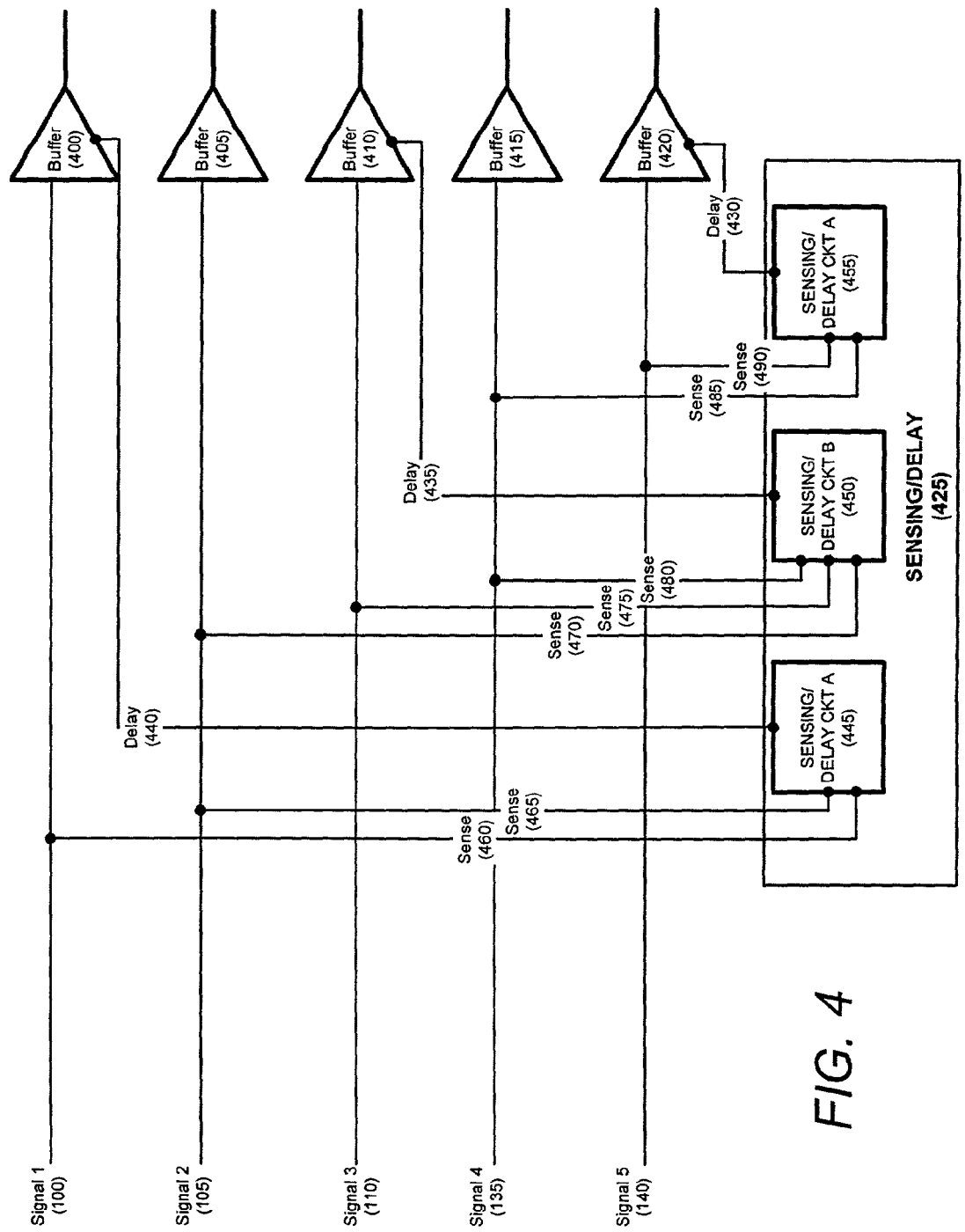
FIG. 4 is a block diagram illustrating use of a sensing and delay circuit and buffers to transition a five-signal group.

FIG. 4 is a block diagram illustrating use of a sensing and delay circuit and buffers to transition a five-signal group. Buffer 400 is used for signal 1 100. Buffer 405 is used for signal 2 105. Buffer 410 is used for signal 3 110. Buffer 415 is used for signal 4 135. Buffer 420 is used for signal 5 140. Buffers 400, 410, and 420 are tn-state buffers that receive delay signals from sensing and delay circuit 425. A received delay signal to the respective buffer tri-states the respective signals. In this particular example delay signal 430 is provided to buffer 420. Delay signal 435 is provided to buffer 410. Delay signal 440 is provided to buffer 400. Sensing and delay circuit 425, in this embodiment, includes three separate circuit or logic blocks: sensing and delay circuit A 445; sensing and delay circuit B 450; and sensing and delay circuit C 455. The respective sensing and delay circuits can include digital, analog, and/or combined circuits that sense and hold signals and trigger respective tri-state buffers 400, 405, 410, 415, and 420. In this particular embodiment, sensing and delay circuit A 445 senses signal 1 100 through sense signal 460 and signal 2 105 through sense signal 465. Sensing and delay circuit B 450 senses signal 2 105 through sense signal 470, signal 3 110 through sense signal 475, and signal 4 135 through sense signal 480. Sensing and delay circuit C 455 senses signal 4 135 through sense signal 485 and signal 5 140 through sense signal 490. The use of sensing and delay circuit 425, in particular sensing and delay circuit 450 and tri-state buffer 410 to delay signal 3, provides a uninterrupted continuous delay. Delay signal 435 is provided to tri-state buffer 410 whenever the delay actually is required to take place. This prevents separate delay glitches that can cause aberrations in signal transmission.

Figure 5:
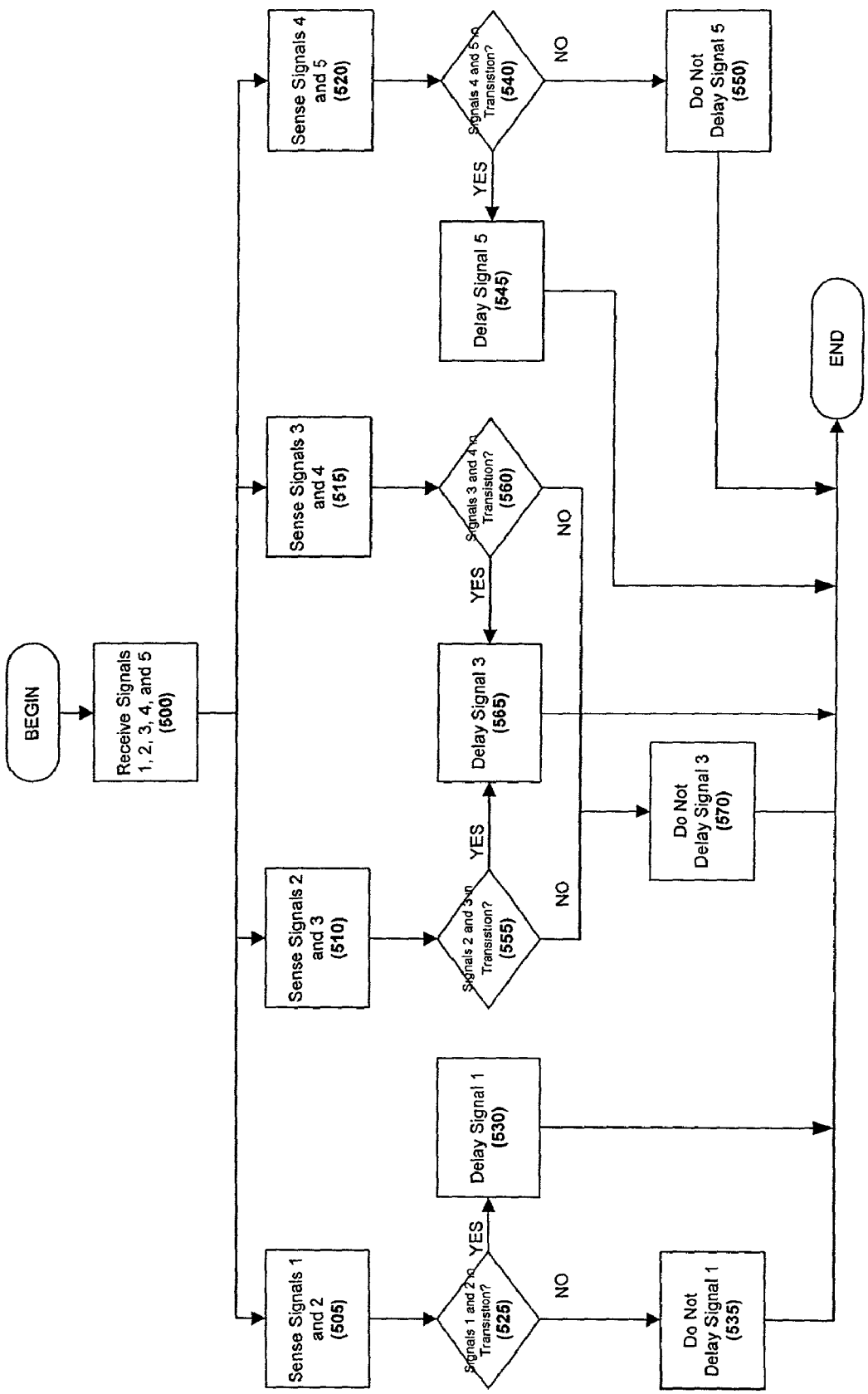
FIG. 5 is a flow diagram illustrating transition of adjacent signals for a five-signal group.

FIG. 5 is a flow diagram illustrating transition of adjacent signals for a five-signal group. FIG. 5 specifically illustrates the logic involved in the block diagram and the sensing and delay circuits of FIG. 4. As in a three-signal group, contention is provided for a five-signal group using a sensing and delay circuit or similar logic. Other multiple signal groups can also make use of such logic and similar sensing and delay circuit (logic). In this example, the sensing and delay circuit receives five signals, signals 1, 2, 3, 4 and 5, step 500. Signals 1, 2, 3, 4, and 5 in order are adjacent to one another in the group. In other words, signal 1 is adjacent to signal 2; signal 2 is adjacent to signal 3; signal 3 is adjacent to signal 4; and signal 4 is adjacent to signal 5. Signals 1 and 2 are sensed with one another, step 505. Signals 2 and 3 are sensed with one another, step 510. Signals 3 and 4 are sensed with one another, step 515. Signals 4 and 5 are sensed with one another, step 520. A determination is made as to whether signals 1 and 2 are transitioning (switching) at the same time, step 525. If step 525 is determined to be "yes" then signal 1 is delayed, step 530. If step 525 is determined to be "no" then signal 1 is not delayed, step 535. A determination is made as to whether adjacent signals 4 and 5 are transitioning at the same time, step 540. If step 540 is determined to be "yes" then signal S is delayed, step 545. Since signal 3 is the middle signal of the five-signal group and is directly adjacent to signals 2 and 4, signal 3 is delayed if signal 3 transitions at the same time as either signal 2 or signal 4. A separate determination is made as to whether signals 2 and 3 are transitioning at the same time, step 555. Another determination is made as to whether signals 3 and 4 are transitioning at the same time, step 560. If either step 555 or step 560 is "yes," signal 3 is delayed, step 565. If both step 555 and step 560 are "no" then signal 3 is not delayed, step 570.

Figure 6:
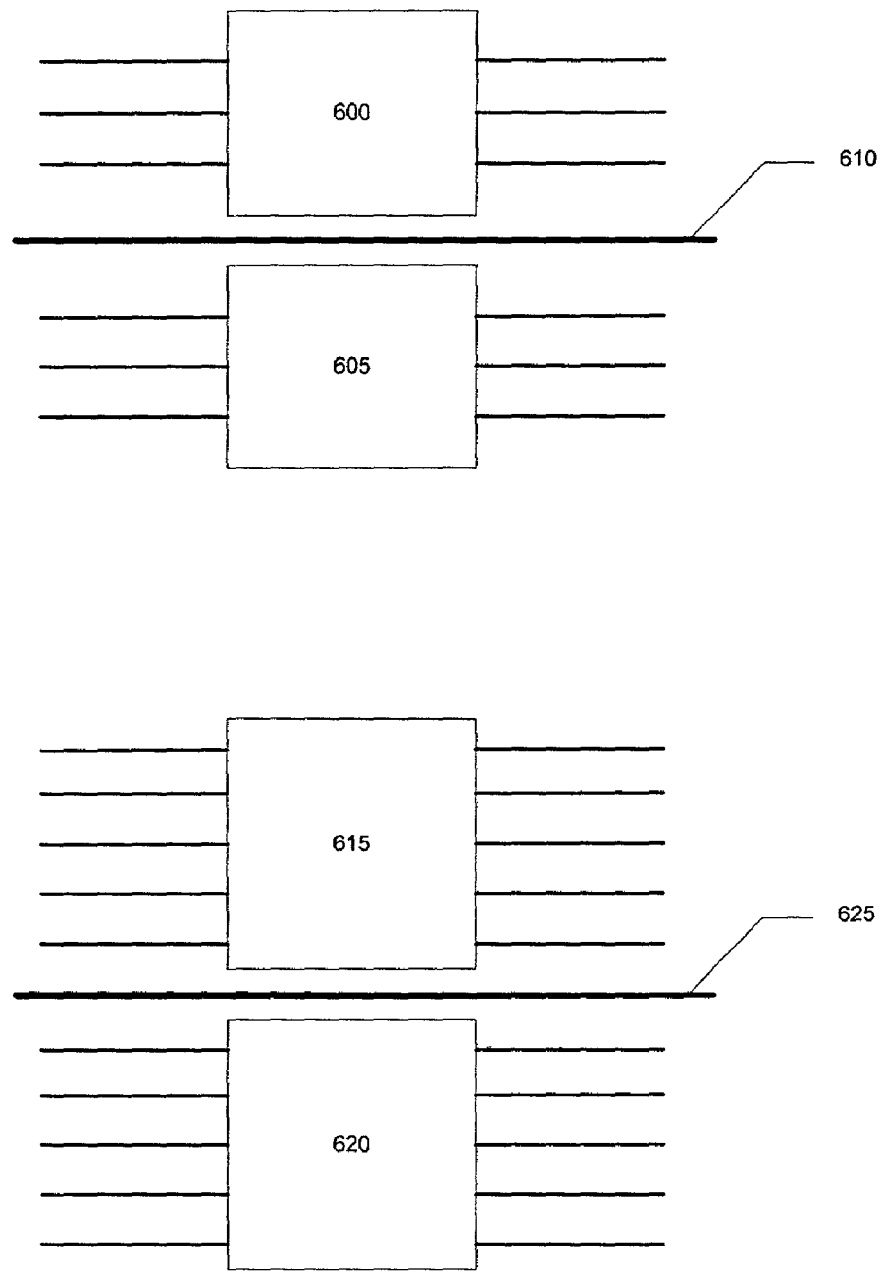
FIG. 6 is a block diagram of three and five signal groups with shield lines.

FIG. 6 is a block diagram of three and five signal groups with shield lines. Sensing and delay circuits can be placed before, after, or in signal drivers. The signal drivers transmitting the signal after delay is provided to the signal. In order to maximize the use of sensing and delay circuits, signals are grouped together and use a single sensing and delay circuit. Signal group 600 is a group of three signals. Signal group 605 is another group of three signals. Groups 600 and 605 can be placed near one another; however, to prevent any coupling between the adjacent signals of the two groups, a shield line 610 is added. Signals in groups 600 and 605 can be placed relatively near one another through the use of the sensing and delay circuits, however some protection and spacing is provided by way of shield line 610. In a similar manner groups of five-signal groups can be provided as illustrated by signal groups 615 and 620, and separated by shield line 625. Other multiple number signal groups can be provided, and variations are possible in the use of various groupings of signals and shield lines. Groupings and use of shield lines are dependent on the circuit or network architecture that is desired.

Although the present invention has been described in connection with several embodiments, the invention is not intended to be limited to the specific forms set forth herein, but on the contrary, it is intended to cover such alternatives, modifications, and equivalents as can be reasonably included with in the scope of the invention as defined by the appended claims.

What is claimed is:

1. A method of transmitting signals in a network comprising:
   receiving a first signal and a second adjacent signal;
   sensing simultaneous transitions of the first signal and the second signal;
   delaying the first signal for a time period based on the simultaneous transitions of the first signal and the second signal;
   switching the second signal; and
   switching the first signal after the time period.

2. The method of claim 1 wherein
   sensing is performed by a sensing and delay circuit.

3. The method of claim 1 wherein
   the first signal is delayed by a first buffer before switching; and
   the second signal is delayed by a second buffer before switching.

4. The method of claim 3 wherein
   sensing is performed by a sensing and delay circuit.

5. The method of claim 4 wherein
   the sensing and delay circuit provides a delay signal to the first buffer and delays the first signal until after the second signal switches.

6. The method of claim 1 further comprising:
   receiving a third signal wherein the first signal is adjacent to the second and the third signal;
   sensing simultaneous transitions of the third signal and the first signal;
   delaying the first signal for a time period based on the simultaneous transitions of the third signal and the first signal;
   switching the third signal; and
   switching the first signal after the time period.

7. The method of claim 6 wherein
sensing is performed by a sensing and delay circuit.

8. The method of claim 7 wherein
the first signal is delayed by a first buffer before switching;
the second signal is delayed by a second buffer before switching, and
the third signal is delayed by a third buffer before switching.

9. The method of claim 8 wherein
sensing is performed by a sensing and delay circuit.

10. The method of claim 9 wherein
the sensing and delay circuit provides a delay signal to the first buffer and delays the first signal until after the second signal and third signal switches.

11. A method of transmitting signals in a network comprising:
receiving a first, a second, a third, a fourth, and a fifth adjacent signals;
sensing transitions of the first, the second, the third, the fourth, and the fifth signals;
delaying switching of the first signal in the event the second signal transitions at the same time as the first signal;
delaying switching of the third signal in the event the second and fourth signals transition at the same time as the third signal; and
delaying switching of the fifth signal in the event the fourth signal transitions at the same time as the fifth signal.

12. The method of claim 11 wherein
sensing is performed by a sensing and delay circuit.

13. The method of claim 11 wherein
the first signal is delayed by a first buffer before switching;
the second signal is delayed by a second buffer before switching;
the third signal is delayed by a third buffer before switching;
the fourth signal is delayed by a fourth buffer before switching; and
the fifth signal is delayed by a fifth buffer before switching.

14. The method of claim 13 wherein
sensing is performed by a sensing and delay circuit.

15. The method of claim 14 wherein
the sensing and delay circuit provides a delay signal to the first buffer and delays the first signal until the second signal switches;
the sensing and delay circuit provides a delay signal to the third buffer and delays the third signal until the second and the fourth signal switch; and
the sensing and delay circuit provides a delay signal to the fifth buffer and delays the fifth signal until the fourth signal switches.

16. A signal transmitting network comprised of
a device configured to:
receive a first signal and a second adjacent signal;
sense simultaneous transitions of the first signal and the second signal;
delay the first signal for a time period based on the simultaneous transitions of the first signal and the second signal;
switch the second signal; and
switch the first signal after the time period.

17. A signal transmitting network comprised of:
a first device configured to:
receive a first signal and a second adjacent signal;
delay the first signal for a time period;
switch the second signal; and
switch the first signal after the time period; and a second device configured to:
sense simultaneous transitions of the first signal and the second signal,
wherein the first signal is delayed based on the simultaneous transitions of the first signal and the second signal.

18. The signal transmitting network of claim 16 further comprised of:
a first buffer that delays the first signal before switching; and
a second buffer that delays the second signal before switching.

19. The signal transmitting network of claim 18 wherein
sensing is performed by a sensing and delay circuit.

20. The signal transmitting network of claim 19 wherein
the second device provides a delay signal to the first buffer and delays the first signal until after the second signal switches.

21. The signal transmitting network of claim 16 wherein
the device is further configured to:
receive a third signal wherein the first signal is adjacent to the second and third signal;
sense simultaneous transitions of the third signal and the first signal;
delay the first signal for a time period based on the simultaneous transitions of the third signal and the first signal;
switch the third signal; and
switch the first signal after the time period.

22. A signal transmitting network comprised of:
a first device configured to:
receive a first signal, a second signal, and third signal wherein the first signal is adjacent to the second signal and the third signal;
delay the first signal for a time period; and
switch the third signal, and the first signal after the time period; and
a second device configured to:
sense simultaneous transitions of the first signal and the third signal1
wherein the first signal is delayed based on the simultaneous transitions of the first signal and the third signal.

23. The signal transmitting network of claim 22 wherein
the first signal is delayed by a first buffer before switching;
the second signal is delayed by a second buffer before switching, and
the third signal is delayed by a third buffer before switching.

24. The signal transmitting network of claim 23 wherein
the second device is a sensing and delay circuit.

25. The signal transmitting network of claim 24 wherein
the second device provides a delay signal to the first buffer and delays the first signal until after the second signal and the third signal switch.

26. A signal transmitting network comprised of
a device configured to:
receive a first, a second, a third, a fourth, and a fifth adjacent signals;
sense transitions of the first, the second, the third, the fourth, and the fifth signals;

delay switching of the first signal in the event the second signal transitions at the same time as the first signal;

delay switching of the third signal in the event the second and fourth signals transition at the same time as the third signal; and delay switching of the fifth signal in the event the fourth signal transitions at the same time as the fifth signal.

27. A signal transmitting network comprised of:

a first device configured to:
 receive a first, a second, a third, a fourth, and a fifth adjacent signals;
 delay switching of the first signal in the event the second signal transitions at the same time as the first signal;
 delay switching of the third signal in the event the second and fourth signals transition at the same time as the third signal; and
 delay switching of the fifth signal in the event the fourth signal transitions at the same time as the fifth signal; and a second device configured to:
 sense transitions of the first, the second, the third, the fourth, and the fifth signals.

28. The signal transmitting network of claim 26 wherein the first signal is delayed by a first buffer before switching;
the second signal is delayed by a second buffer before switching;
the third signal is delayed by a third buffer before switching;
the fourth signal is delayed by a fourth buffer before switching; and
the fifth signal is delayed by a fifth buffer before switching.

29. The signal transmitting network of claim 28 wherein sensing is preformed by a sensing and delay circuit.

30. The signal transmitting network of claim 29 wherein the sensing and delay circuit provides a delay signal to the first buffer and delays the first signal until the second signal switches;
the sensing and delay circuit provides a delay signal to the third buffer and delays the third signal until the second and the fourth signal switch; and
the sensing and delay circuit provides a delay signal to the fifth buffer and delays the fifth signal until the fourth signal switches.

31. An apparatus for transmitting signals in a network comprised of:

means for receiving a first signal and a second adjacent signal;
means for sensing simultaneous transitions of the first signal and the second signal;
means for delaying the first signal for a time period based on the simultaneous transitions of the first signal and the second signal;
means for switching the second signal; and
means for switching the first signal after the time period.

32. The apparatus claim 31 wherein
the means for sensing is performed by a sensing and delay circuit.

33. The apparatus of claim 31 wherein
the first signal is delayed by a first buffer before switching; and
the second signal is delayed by a second buffer before switching.

34. The apparatus of claim 33 wherein
the means for sensing is performed by a sensing and delay circuit.

35. The apparatus of claim 34 wherein
the sensing and delay circuit provides a delay signal to the first buffer and delays the first signal until after the second signal switches.

36. The apparatus of claim 31 further comprising:
means for receiving a third signal wherein the first signal is adjacent to the second and the third signal;
means for sensing simultaneous transition of the third signal and the first signal;
means for delaying the first signal for a time period based on the simultaneous transitions of the third signal and the first signal;
means for switching the third signal; and
means for switching the first signal after the time period.

37. The apparatus of claim 36 wherein
the means for sensing is performed by a sensing and delay circuit.

38. The apparatus of claim 37 wherein
the first signal is delayed by a first buffer before switching;
the second signal is delayed by a second buffer before switching, and
the third signal is delayed by a third buffer before switching.

39. The apparatus of claim 38 wherein
the means for sensing is performed by a sensing and delay circuit.

40. The apparatus of claim 39 wherein
the sensing and delay circuit provides a delay signal to the first buffer and delays the first signal until after the second signal and third signal switches.

41. An apparatus for transmitting signals in a network comprising:
means for receiving a first, a second, a third, a fourth, and a fifth adjacent signals;
means for sensing transitions of the first, the second, the third, the fourth, and the fifth signals;
means for delaying switching of the first signal in the event the second signal transitions at the same time as the first signal;
means for delaying switching of the third signal in the event the second and fourth signals transition at the same time as the third signal; and
means for delaying switching of the fifth signal in the event the fourth signal transitions at the same time as the fifth signal.

42. The apparatus of claim 41 wherein
the means for sensing is performed by a sensing and delay circuit.

43. The apparatus of claim 41 wherein
the first signal is delayed by a first buffer before switching;
the second signal is delayed by a second buffer before switching;
the third signal is delayed by a third buffer before switching;
the fourth signal is delayed by a fourth buffer before switching; and
the fifth signal is delayed by a fifth buffer before switching.

44. The apparatus of claim 43 wherein
the means for sensing is a sensing and delay circuit.

45. The apparatus of claim 44 wherein
the sensing and delay circuit provides a delay signal to the first buffer and delays the first signal until the second signal switches;
the sensing and delay circuit provides a delay signal to the third buffer and delays the third signal until the second and the fourth signal switch; and the sensing and delay circuit provides a delay signal to the fifth buffer and delays the fifth signal until the fourth signal switched.

46. An apparatus comprising:
a circuit configured to detect a transition of a first signal and a transition of a second signal and provide a delay signal when the transitions of the first and the second signals occur simultaneously; and
a first buffer coupled to the circuit, wherein the first buffer is configured to delay the transition of the first signal in response to the delay signal.

47. The apparatus of claim 46, wherein the first buffer is configured to delay the transition of the first signal until the transition of the second signal has completed.

48. The apparatus of claim 46, wherein
the circuit is further configured to detect a transition of a third signal and provide the delay signal when the transitions of the first and third signals occur simultaneously.

49. The apparatus of claim 48, wherein the first buffer is further configured to delay the transition of the first signal until the transition of the third signal has completed.

50. The apparatus of claim 48 further comprising:
a second buffer configured to receive the second signal and provide a delayed second signal, wherein a delay of the second buffer is equal to an inherent delay of the first buffer; and
a third buffer configured to receive the third signal and provide a delayed third signal, wherein a delay of the third buffer is equal to the inherent delay of the first buffer.

51. The apparatus of claim 50 wherein the first signal is adjacent to the second signal and the third signal.

52. The apparatus of claim 50 further comprising:
a first sense signal, wherein the first signal is coupled to the circuit via the first sense signal;
a second sense signal, wherein the second signal is coupled to the circuit via the second sense signal; and
a third sense signal, wherein the third signal is coupled to the circuit via the third sense signal.

53. The apparatus of claim 46 further comprising:
an integrated circuit coupled to the circuit.

54. An apparatus comprising:
a circuit configured to detect a transition of each signal of a plurality of signals and provide a delay signal when any adjacent signals simultaneously transition; and
a plurality of buffers coupled to the circuit, wherein at least one buffer of the plurality is configured to delay at least one transition in response to the delay signal.

55. The apparatus of claim 54, wherein the at least one buffer is configured to delay the at least one transition until all adjacent transitions to the at least one transition have completed.

56. The apparatus of claim 54, further comprising:
a first circuit configured to detect a transition of a first signal and a transition of a second signal and provide a first delay signal when the transitions of the first and second signals occur simultaneously; and
a first buffer coupled to the first circuit, wherein the first buffer is configured to delay the transition of the first signal in response to the first delay signal.

57. The apparatus of claim 56, wherein the first signal is adjacent to the second signal.

58. The apparatus of claim 57, wherein in response to the first delay signal the first buffer is further configured to delay the transition of the first signal until the transition of the second signal has completed.

59. The apparatus of claim 56, further comprising:
a second circuit configured to detect a transition of the second signal, a transition of a third signal, and a transition of a fourth signal and provide a second delay signal when the transition of the third signal occurs simultaneously with at least one of the transition of the second signal and the transition of the fourth signal; and
a second buffer coupled to the second circuit, wherein the second buffer is configured to delay the transition of the third signal in response to the second delay signal.

60. The apparatus of claim 59, wherein the third signal is adjacent to the second signal and the fourth signal.

61. The apparatus of claim 59, wherein in response to the second delay signal the second buffer is further configured to delay the transition of the third signal until the transition of at least one of the third signal and the fourth signal has completed.

62. The apparatus of claim 59, further comprising:
a third circuit configured to detect a transition of the fourth signal and a transition of a fifth signal and provide a third delay signal when the transitions of the fourth and fifth signals occur simultaneously; and
a third buffer coupled to the third circuit, wherein the third buffer is configured to delay the transition of the fifth signal in response to the third delay signal.

63. The apparatus of claim 62, wherein the fourth signal is adjacent to the fifth signal.

64. The apparatus of claim 62, wherein in response to the third delay signal the third buffer is further configured to delay the transition of the fifth signal until the transition of the fourth signal has completed.

65. The apparatus of claim 62 further comprising:
a fourth buffer configured to receive the second signal and provide a delayed second signal, wherein a delay of the second buffer is equal to an inherent delay of the first buffer; and
a fifth buffer configured to receive the fourth signal and provide a delayed fourth signal, wherein a delay of the fifth buffer is equal to the inherent delay of the third buffer.

66. The apparatus of claim 54, further comprising:
a second circuit configured to detect a transition of each signal of a second plurality of signals and provide a second delay signal when any adjacent signals simultaneously transition;
a second plurality of buffers coupled to the second circuit, wherein at least one buffer of the second plurality is configured to delay at least one transition in response to the second delay signal; and
a shield line between the plurality of signals and the second plurality of signals.

* * * * *